United States Patent
Xie et al.

(10) Patent No.: US 9,070,711 B2
(45) Date of Patent: Jun. 30, 2015

(54) METHODS OF FORMING CAP LAYERS FOR SEMICONDUCTOR DEVICES WITH SELF-ALIGNED CONTACT ELEMENTS AND THE RESULTING DEVICES

(71) Applicant: GLOBALFOUNDRIES Inc., Grand Cayman (KY)

(72) Inventors: Ruilong Xie, Niskayuna, NY (US); Xiuyu Cai, Niskayuna, NY (US); Larry Zhao, Hoeilaart (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 54 days.

(21) Appl. No.: 13/957,991

(22) Filed: Aug. 2, 2013

(65) Prior Publication Data

US 2015/0035086 A1    Feb. 5, 2015

(51) Int. Cl.
*H01L 29/66*    (2006.01)
*H01L 29/51*    (2006.01)

(52) U.S. Cl.
CPC ........ *H01L 29/66545* (2013.01); *H01L 29/511* (2013.01)

(58) Field of Classification Search
CPC ................... H01L 21/76895; H01L 21/76897; H01L 21/823871; H01L 29/66545; H01L 29/78; H01L 29/511
See application file for complete search history.

(56) References Cited

U.S. PATENT DOCUMENTS

| | | | |
|---|---|---|---|
| 2012/0139061 A1* | 6/2012 | Ramachandran et al. | 257/410 |
| 2014/0197468 A1* | 7/2014 | Xie et al. | 257/288 |
| 2014/0264486 A1* | 9/2014 | Pham et al. | 257/288 |
| 2014/0264487 A1* | 9/2014 | Pham et al. | 257/288 |

OTHER PUBLICATIONS

Ashurst et al., "Dichlorodimethylsilane as an Anti-Stiction Monolayer for MEMS: A Comparison to the Octadecyltrichlosilane Self-Assembled Monolayer," Journal of Microelectromechanical Systems, 10:41-49, 2001.
DiBenedetto et al., "Molecular Self-Assembled Monolayers and Multilayers for Organic and Unconventional Inorganic Thin-Film Transistor Applications," Adv. Mater, 21:1407-33, 2009.
Ulman, "Formation and Structure of Self-Assembled Monolayers," Chem. Rev., 96:1533-54, 1996.

* cited by examiner

*Primary Examiner* — Whitney T Moore
(74) *Attorney, Agent, or Firm* — Amerson Law Firm, PLLC

(57) ABSTRACT

One method disclosed herein includes forming an etch stop layer above recessed sidewall spacers and a recessed replacement gate structure and, with the etch stop layer in position, forming a self-aligned contact that is conductively coupled to the source/drain region after forming the self-aligned contact. A device disclosed herein includes an etch stop layer that is positioned above a recessed replacement gate structure and recessed sidewall spacers, wherein the etch stop layer defines an etch stop recess that contains a layer of insulating material positioned therein. The device further includes a self-aligned contact.

23 Claims, 10 Drawing Sheets

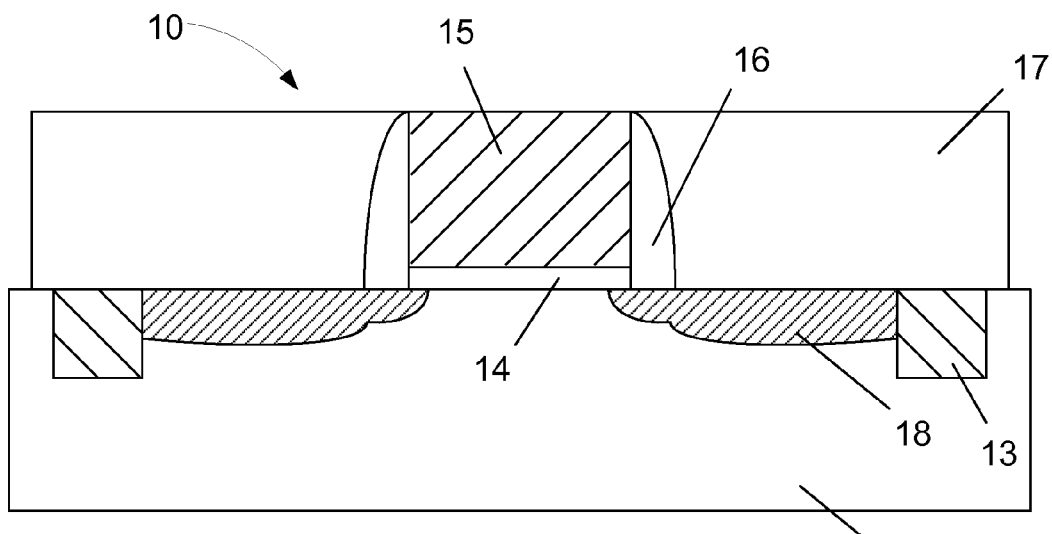
(Prior Art) Figure 1A
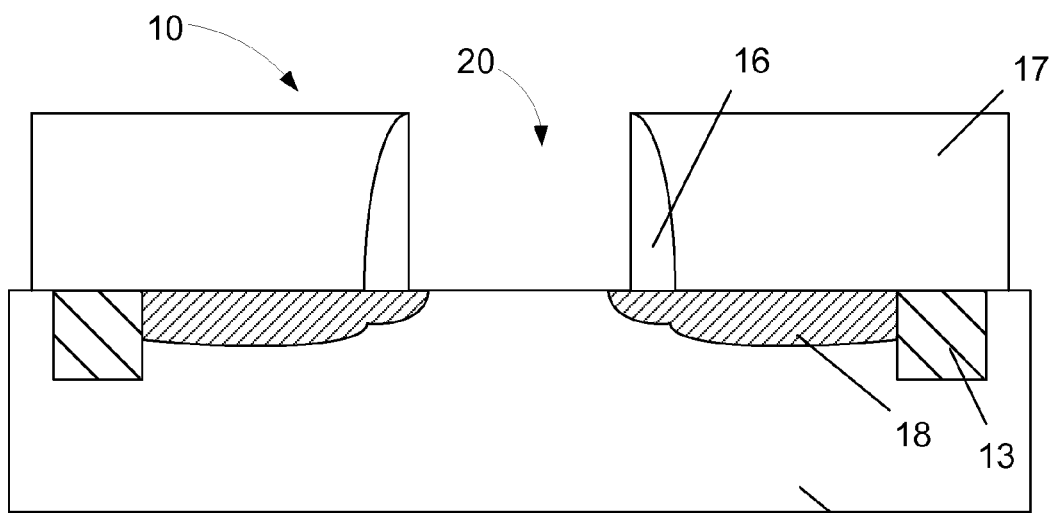
(Prior Art) Figure 1B

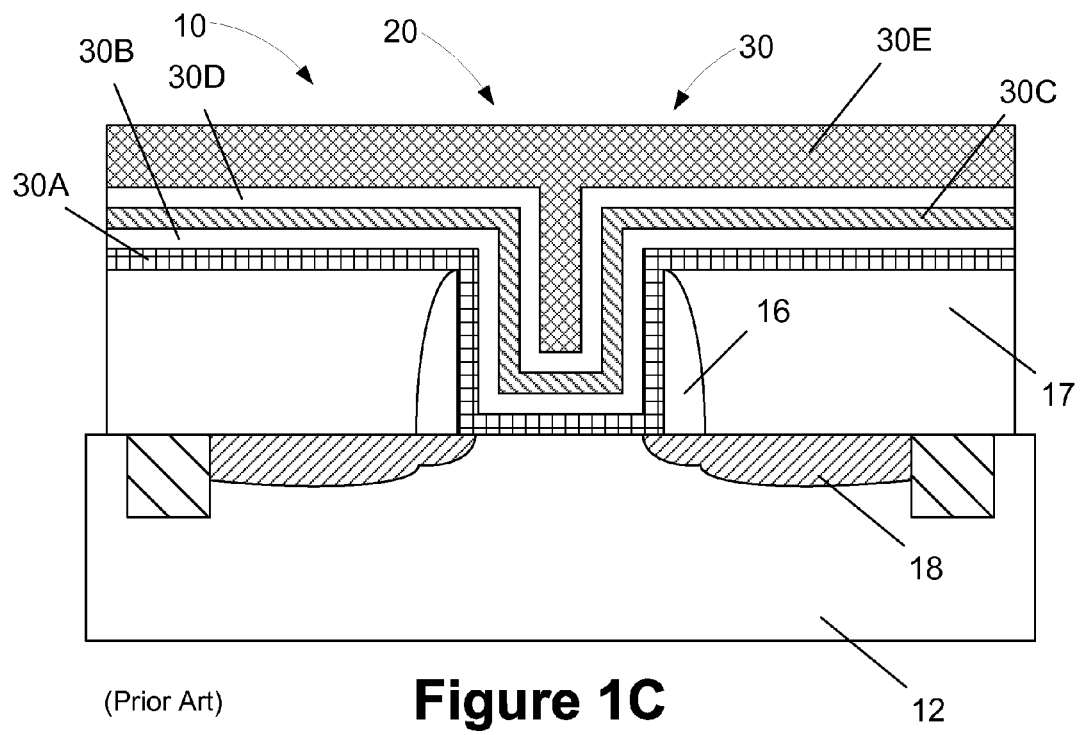
(Prior Art) Figure 1C
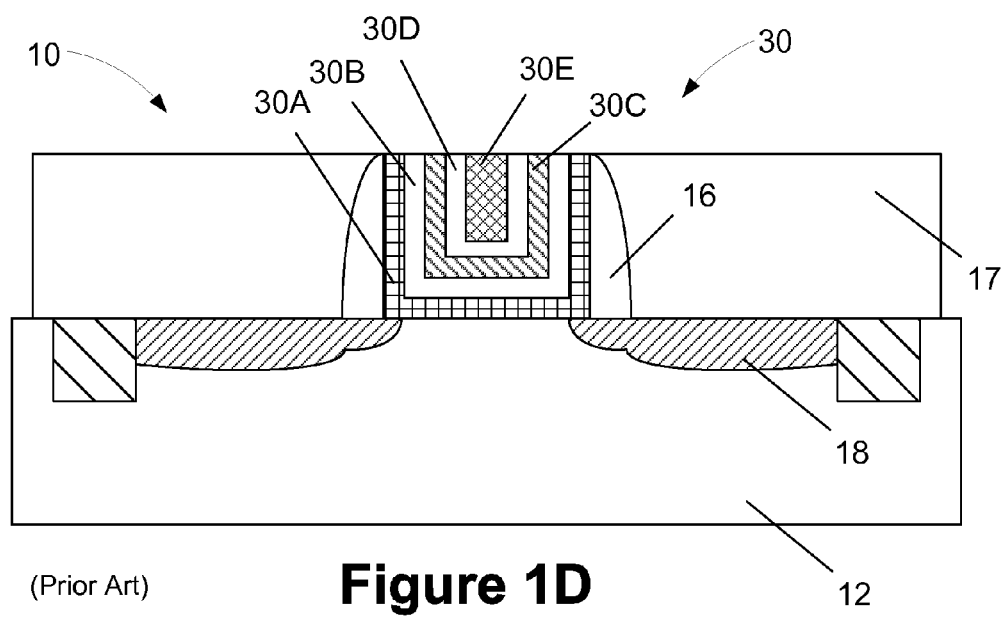
(Prior Art) Figure 1D

METHODS OF FORMING CAP LAYERS FOR SEMICONDUCTOR DEVICES WITH SELF-ALIGNED CONTACT ELEMENTS AND THE RESULTING DEVICES

BACKGROUND OF THE INVENTION

1. Field of the Invention

The present disclosure generally relates to the fabrication of integrated circuits, and, more particularly, to various methods of forming cap layers for semiconductor devices with self-aligned contacts, and the resulting semiconductor devices.

2. Description of the Related Art

In modern integrated circuits, such as microprocessors, storage devices and the like, a very large number of circuit elements, especially transistors, are provided and operated on a restricted chip area. Immense progress has been made over recent decades with respect to increased performance and reduced feature sizes of circuit elements, such as transistors. However, the ongoing demand for enhanced functionality of electronic devices forces semiconductor manufacturers to steadily reduce the dimensions of the circuit elements and to increase the operating speed of the circuit elements. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive currents than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

For many early device technology generations, the gate structures of most transistor elements were comprised of a plurality of silicon-based materials, such as a silicon dioxide and/or silicon oxynitride gate insulation layer, in combination with a polysilicon gate electrode. However, as the channel length of aggressively scaled transistor elements has become increasingly smaller, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that include a so-called high-k dielectric gate insulation layer and one or metal layers that function as the gate electrode (HK/MG) have been implemented. Such alternative gate structures have been shown to provide significantly enhanced operational characteristics over the heretofore more traditional silicon dioxide/polysilicon gate structure configurations.

Depending on the specific overall device requirements, several different high-k materials—i.e., materials having a dielectric constant, or k-value, of approximately 10 or greater—have been used with varying degrees of success for the gate insulation layer in an HK/MG gate electrode structure. For example, in some transistor element designs, a high-k gate insulation layer may include tantalum oxide ($Ta_2O_5$), hafnium oxide ($HfO_2$), zirconium oxide ($ZrO_2$), titanium oxide ($TiO_2$), aluminum oxide ($Al_2O_3$), hafnium silicates ($HfSiO_x$) and the like. Furthermore, one or more non-polysilicon metal gate electrode materials—i.e., a metal gate stack—may be used in HK/MG configurations so as to control the work function of the transistor. These metal gate electrode materials may include, for example, one or more layers of titanium (Ti), titanium nitride (TiN), titanium-aluminum (TiAl), titanium-aluminum-carbon (TiALC), aluminum (Al), aluminum nitride (AlN), tantalum (Ta), tantalum nitride (TaN), tantalum carbide (TaC), tantalum carbonitride (TaCN), tantalum silicon nitride (TaSiN), tantalum silicide (TaSi) and the like.

One well-known processing method that has been used for forming a transistor with a high-k/metal gate structure is the so-called "gate last" or "replacement gate" technique. The replacement gate process may be used when forming planar devices or 3D devices. FIGS. 1A-1D simplistically depict one illustrative prior art method for forming an HK/MG replacement gate structure using a replacement gate technique. As shown in FIG. 1A, the process includes the formation of a basic transistor structure above a semiconducting substrate 12 in an active area defined by a shallow trench isolation structure 13. At the point of fabrication depicted in FIG. 1A, the device 10 includes a sacrificial gate insulation layer 14, a dummy or sacrificial gate electrode 15, sidewall spacers 16, a layer of insulating material 17 and source/drain regions 18 formed in the substrate 12. The various components and structures of the device 10 may be formed using a variety of different materials and by performing a variety of known techniques. For example, the sacrificial gate insulation layer 14 may be comprised of silicon dioxide, the sacrificial gate electrode 15 may be comprised of polysilicon, the sidewall spacers 16 may be comprised of silicon nitride and the layer of insulating material 17 may be comprised of silicon dioxide. The source/drain regions 18 may be comprised of implanted dopant materials (N-type dopants for NMOS devices and P-type dopants for PMOS devices) that are implanted into the substrate 12 using known masking and ion implantation techniques. Of course, those skilled in the art will recognize that there are other features of the transistor 10 that are not depicted in the drawings for purposes of clarity. For example, so-called halo implant regions are not depicted in the drawings, as well as various layers or regions of silicon/germanium that are typically found in high performance PMOS transistors. At the point of fabrication depicted in FIG. 1A, the various structures of the device 10 have been formed and a chemical mechanical polishing (CMP) process has been performed to remove any materials above the sacrificial gate electrode 15 (such as a protective cap layer (not shown) comprised of silicon nitride) so that at least the sacrificial gate electrode 15 may be removed.

As shown in FIG. 1B, one or more etching processes are performed to remove the sacrificial gate electrode 15 and the sacrificial gate insulation layer 14 to thereby define a gate cavity 20 where a replacement gate structure will subsequently be formed. Typically, the sacrificial gate insulation layer 14 is removed as part of the replacement gate technique, as depicted herein. However, the sacrificial gate insulation layer 14 may not be removed in all applications.

Next, as shown in FIG. 1C, various layers of material that will constitute a replacement gate structure 30 are formed in the gate cavity 20. Even in cases where the sacrificial gate insulation layer 14 is intentionally removed, there will typically be a very thin native oxide layer (not shown) that forms on the substrate 12 within the gate cavity 20. The materials used for the replacement gate structures 30 for NMOS and PMOS devices are typically different. For example, the replacement gate structure 30 for an NMOS device may be comprised of a high-k gate insulation layer 30A, such as hafnium oxide, having a thickness of approximately 2 nm, a first metal layer 30B (e.g., a layer of titanium nitride with a thickness of about 1-2 nm), a second metal layer 30C—a so-called work function adjusting metal layer for the NMOS device—(e.g., a layer of titanium-aluminum or titanium-aluminum-carbon with a thickness of about 5 nm), a third metal layer 30D (e.g., a layer of titanium nitride with a thickness of about 1-2 nm) and a bulk metal layer 30E, such as aluminum or tungsten. Ultimately, as shown in FIG. 1D, one or more CMP processes are performed to remove excess portions of the gate insulation layer 30A, the first metal layer 30B, the second metal layer 30C, the third metal layer 30D and the bulk metal layer 30E positioned outside of the gate cavity 20 to thereby define the replacement gate structure 30 for an illustrative NMOS device. Although not depicted in FIGS. 1A-1D, in some process flows, an etch-back process is performed on the layers 30A-D after they are formed in the gate cavity 20 to make room within the upper portion of the gate cavity 20 for the bulk metal layer 30E, i.e., to define a recess where the bulk metal layer 30E may be formed. Thereafter, an etch-back process may be performed on the bulk metal layer 30E within the gate cavity 20 to reduce its thickness so as to make room for the formation of a gate cap layer (not shown) made of, for example, silicon nitride that is formed above the recessed bulk metal layer 30E. Typically, the replacement metal gate structure 30 for a PMOS device does not include as many metal layers as does an NMOS device. For example, the gate structure 30 for a PMOS device may only include the high-k gate insulation layer 30A, a single layer of titanium nitride—the work function adjusting metal for the PMOS device—having a thickness of about 3-4 nm, and the bulk metal layer 30E.

Over recent years, due to the reduced dimensions of the transistor devices, the operating speed of the circuit components has been increased with every new device generation and the "packing density," i.e., the number of transistor devices per unit area, in such products has also increased during that time. Such improvements in the performance of transistor devices has reached the point where one limiting factor relating to the operating speed of the final integrated circuit product is no longer the individual transistor element but the electrical performance of the complex wiring system that is formed above the device level that includes the actual semiconductor-based circuit elements. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the intra-level electrical connection, and also include a plurality of inter-level connections or vertical connections, which are also referred to as vias. These vertical interconnect structures comprise an appropriate metal and provide the electrical connection of the various stacked metallization layers.

Furthermore, in order to actually connect the circuit elements formed in the semiconductor material with the metallization layers, an appropriate vertical contact structure is provided, a first end of which is connected to a respective contact region of a circuit element, such as a gate electrode and/or the drain and source regions of transistors, and a second end that is connected to a respective metal line in the metallization layer by a conductive via. In some applications, the second end of the contact structure may be connected to a contact region of a further semiconductor-based circuit element, in which case the interconnect structure in the contact level is also referred to as a local interconnect. The contact structure may comprise contact elements or contact plugs having a generally square or round cross-sectional shape (when viewed from above) that are formed in an interlayer dielectric material, which in turn encloses and passivates the circuit elements. As the critical dimensions of the circuit elements in the device level were decreased, the dimensions of metal lines, vias and contact elements were also reduced. In some cases, the increased packing density mandated the use of sophisticated metal-containing materials and dielectric materials in order to reduce the parasitic capacitance in the metallization layers and provide a sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower-lying metallization levels, metal lines and vias having critical dimensions of approximately 100 nm and significantly less may have to be provided in order to achieve the required packing density in accordance with density of circuit elements in the device level.

As device dimensions have decreased, the conductive contact elements in the contact level have to be provided with critical dimensions in the same order of magnitude. The contact elements typically represent plugs, which are formed of an appropriate metal or metal composition, wherein, in sophisticated semiconductor devices, tungsten, in combination with appropriate barrier materials, has proven to be a viable contact metal. When forming tungsten-based contact elements, typically the interlayer dielectric material is formed first and is patterned so as to receive contact openings, which extend through the interlayer dielectric material to the corresponding contact areas of the circuit elements. In particular, in densely packed device regions, the lateral size of the drain and source areas and thus the available area for the contact regions is 100 nm and significantly less, thereby requiring extremely complex lithography and etch techniques in order to form the contact openings with well-defined lateral dimensions and with a high degree of alignment accuracy.

For this reason, contact technologies have been developed in which contact openings are formed in a "self-aligned" manner by removing dielectric material, such as silicon dioxide, selectively from the spaces between closely spaced gate electrode structures. That is, after completing the transistor structure, the gate electrode structures are used as etch masks for selectively removing the silicon dioxide material (and other layers of material if present) in order to expose the source/drain regions of the transistors, thereby providing self-aligned trenches or openings which are substantially laterally delineated by the spacer structures of the gate electrode structures. Consequently, a corresponding lithography process only needs to define a global contact opening above an active region, wherein the contact trenches then result from the selective etch process using the gate electrode structures and spacers, i.e., the portions exposed by the global contact opening, as an etch mask. Thereafter, an appropriate contact material, such as tungsten and the like, may be filled into the contact trenches or openings.

However, the aforementioned process of forming self-aligned contacts results in an undesirable loss of the materials that protect the conductive gate electrode, i.e., the gate cap layer and the sidewall spacers, as will be explained with reference to FIGS. 2A-2B. FIG. 2A schematically illustrates a cross-sectional view of an integrated circuit product 40 at an advanced manufacturing stage. As illustrated, the product 40 comprises a plurality of illustrative gate structures 41 that are formed above a substrate 42, such as a silicon substrate. The gate structures 41 are comprised of an illustrative gate insulation layer 43 and an illustrative gate electrode 44. An illustrative gate cap layer 46 and sidewall spacers 48 encapsulate and protect the gate structures 41. The gate cap layer 46 and sidewall spacers 48 are typically made of silicon nitride. Also depicted in FIG. 2A are a plurality of raised source/drain regions 50 and a layer of insulating material 52, e.g., silicon dioxide. FIG. 2B depicts the product 40 after a contact opening 54 has been formed in the layer of insulating material 52 for a self-aligned contact. Although the contact etch process performed to form the opening 54 is primarily directed at removing the desired portions of the layer of insulating material 52, portions of the protective gate cap layer 46 and the protective sidewall spacers 48 get consumed during the contact etch process, as simplistically depicted in the dashed regions 56. Given that the cap layer 46 and the spacers 48 are attacked in the contact etch process, the thickness of these protective materials must be sufficient such that, even after the contact etch process is completed, there remains sufficient cap layer material and spacer material to protect the gate structures 41. Accordingly, device manufacturers tend to make the cap layers 46 and spacers 48 "extra thick," i.e., with an additional thickness that may otherwise not be required but for the consumption of the cap layers 46 and the spacers 48 during the contact etch process. In turn, increasing the thickness of such structures, i.e., increasing the thickness of the gate cap layers 46, causes other problems, such as increasing the aspect ratio of the contact opening 54 due to the increased height, increasing the initial gate height, which makes the gate etching and spacer etching processes more difficult, etc.

The present disclosure is directed to various methods of forming cap layers for semiconductor devices with self-aligned contacts, and the resulting semiconductor devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming cap layers for semiconductor devices with self-aligned contacts, and the resulting semiconductor devices. One illustrative method disclosed includes, among other things, forming a replacement gate structure that is positioned within a gate cavity that is laterally defined by sidewall spacers positioned in a first layer of insulating material, performing at least one etching process to recess the sidewall spacers and the replacement gate structure and thereby define recessed sidewall spacers and a recessed replacement gate structure, and forming an etch stop layer above the recessed sidewall spacers and the recessed replacement gate structure, wherein the etch stop layer defines an etch stop recess. In this embodiment, the method also includes forming a second layer of insulating material in the etch stop recess, forming a third layer of insulating material above the second layer of insulating material and above the etch stop layer, with the etch stop layer in position, performing at least one first contact etching process to form a self-aligned contact opening that extends through at least the third layer of insulating material and the first layer of insulating material and thereby expose a source/drain region of the transistor and, with the etch stop layer in position, forming a self-aligned contact in the self-aligned contact opening that is conductively coupled to the source/drain region.

Another illustrative method disclosed herein includes, among other things, forming a replacement gate structure that is positioned within a gate cavity that is laterally defined by sidewall spacers positioned in a first layer of insulating material, performing at least one etching process to recess the sidewall spacers and the replacement gate structure and thereby define recessed sidewall spacers and a recessed replacement gate structure, selectively forming a second layer of insulating material on an upper surface of the recessed replacement gate structure and forming an etch stop layer comprised of high-k insulating material above the recessed sidewall spacers, the recessed replacement gate structure, the second layer of insulating material and above an upper surface of the first layer of insulating material, wherein the etch stop layer defines an etch stop recess. In this embodiment, the method also includes depositing a third layer of insulating material above the etch stop layer so as to over-fill the etch stop recess, performing at least one planarization process to remove portions of the third layer of insulating material and portions of the etch stop layer positioned above the upper surface of the first layer of insulating material, forming a fourth layer of insulating material above the third layer of insulating material and above the etch stop layer, with the etch stop layer in position, performing at least one first contact etching process to form a self-aligned contact opening that extends through at least the fourth and first layers of insulating material and thereby expose a source/drain region of the transistor and, with the etch stop layer in position, forming a self-aligned contact in the self-aligned contact opening that is conductively coupled to the source/drain region.

One illustrative device disclosed herein includes, among other things, a replacement gate structure positioned above a semiconductor substrate, sidewall spacers positioned adjacent the replacement gate structure, a first layer of insulating material positioned above the substrate adjacent the sidewall spacers, an etch stop layer positioned above upper surfaces of the sidewall spacers and the replacement gate structure, wherein the etch stop layer defines an etch stop recess, a second layer of insulating material positioned within the etch stop recess, wherein the second layer of insulating material has an upper surface that is substantially planar with an upper surface of the first layer of insulating material, a third layer of insulating material positioned above the first layer of insulating material, the second layer of insulating material and the etch stop layer, and a conductive contact positioned in an opening formed in at least the third layer of insulating material and the first layer of material, wherein the conductive contact is conductively coupled to a source/drain region of the transistor.

Yet another illustrative device disclosed herein includes, among other things, a replacement gate structure positioned above a semiconductor substrate, sidewall spacers positioned adjacent the replacement gate structure, wherein the upper surface of the sidewall spacers is positioned at a level that is above a level of an upper surface of the replacement gate structure, a first layer of insulating material positioned above the substrate adjacent the sidewall spacers, a second layer of insulating material positioned on the upper surface of the replacement gate structure, an etch stop layer positioned on the upper surfaces of the sidewall spacers and on an upper surface of the second layer of insulating material, wherein the etch stop layer defines an etch stop recess, a third layer of insulating material positioned within the etch stop recess, wherein the third layer of insulating material has an upper surface that is substantially planar with the upper surface of the first layer of insulating material, a fourth layer of insulating material positioned above the first layer of insulating material, the third layer of insulating material and the etch stop layer, and a conductive contact positioned in an opening formed in at least the fourth layer of insulating material and the first layer of material, wherein the conductive contact is conductively coupled to a source/drain region of the transistor.

BRIEF DESCRIPTION OF THE DRAWINGS

The disclosure may be understood by reference to the following description taken in conjunction with the accompanying drawings, in which like reference numerals identify like elements, and in which:

FIGS. 1A-1D depict one illustrative prior art method of forming a gate structure of transistors using a so-called "replacement gate" technique;

Figure 2A:
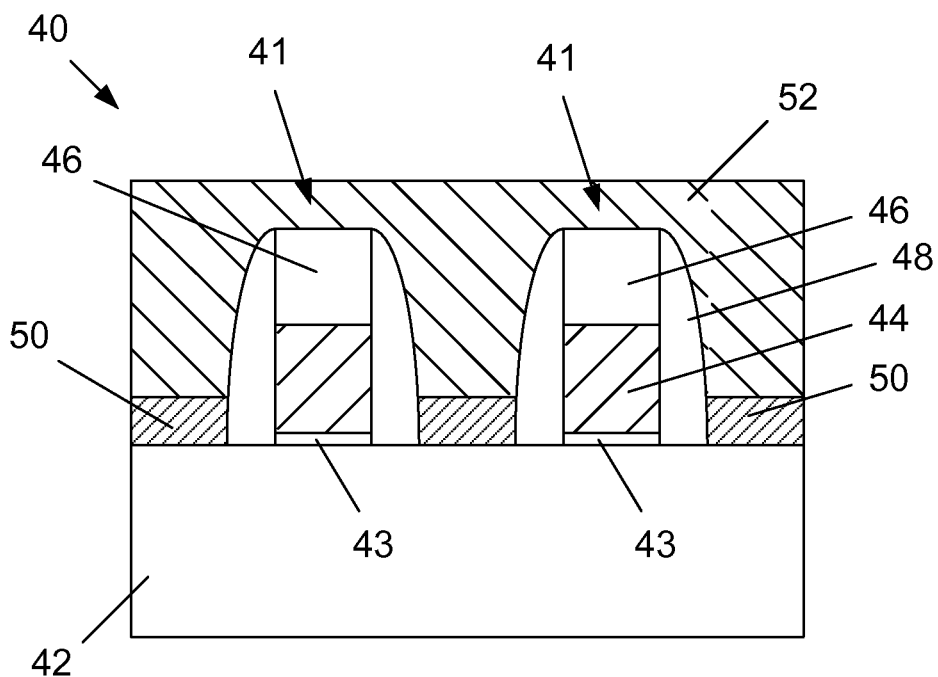
FIGS. 2A-2B schematically illustrate a cross-sectional view of an illustrative prior art integrated circuit product that employs self-aligned contacts.
Figure 2B:
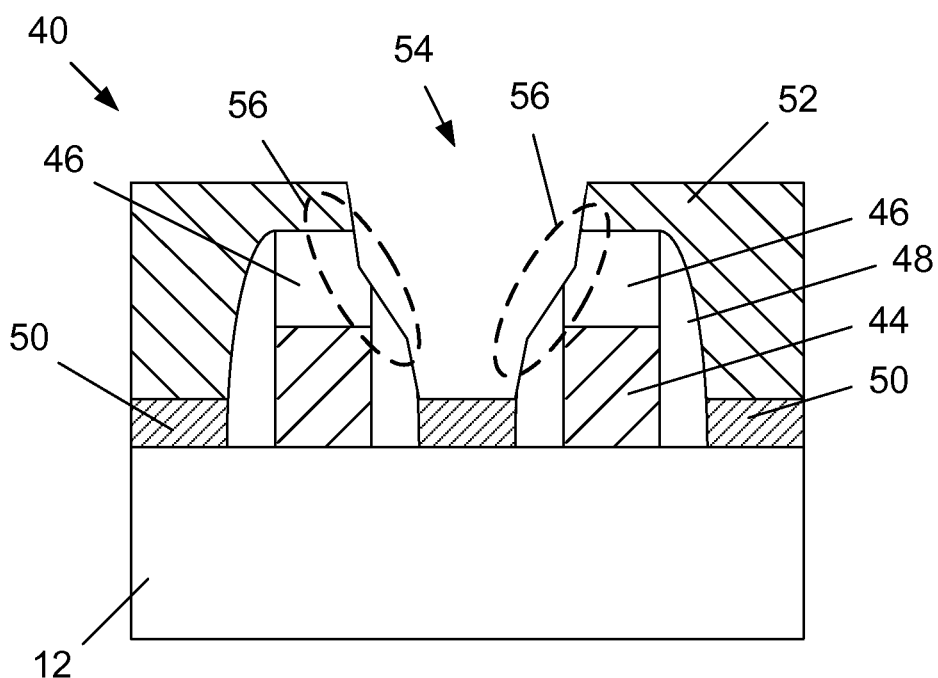

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming cap layers for semiconductor devices with self-aligned contacts, and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

As will be appreciated by those skilled in the art after a complete reading of the present application, the inventions disclosed herein may be employed in forming integrated circuit products using planar transistor devices, as well as so-called 3D devices, such as FiNFETs, or a combination of such devices. For purposes of disclosure, reference will be made to an illustrative process flow wherein an integrated circuit product is formed with a plurality of planar transistor devices. However, the inventions disclosed herein should not be considered to be limited to such an illustrative example.

Figure 3A:
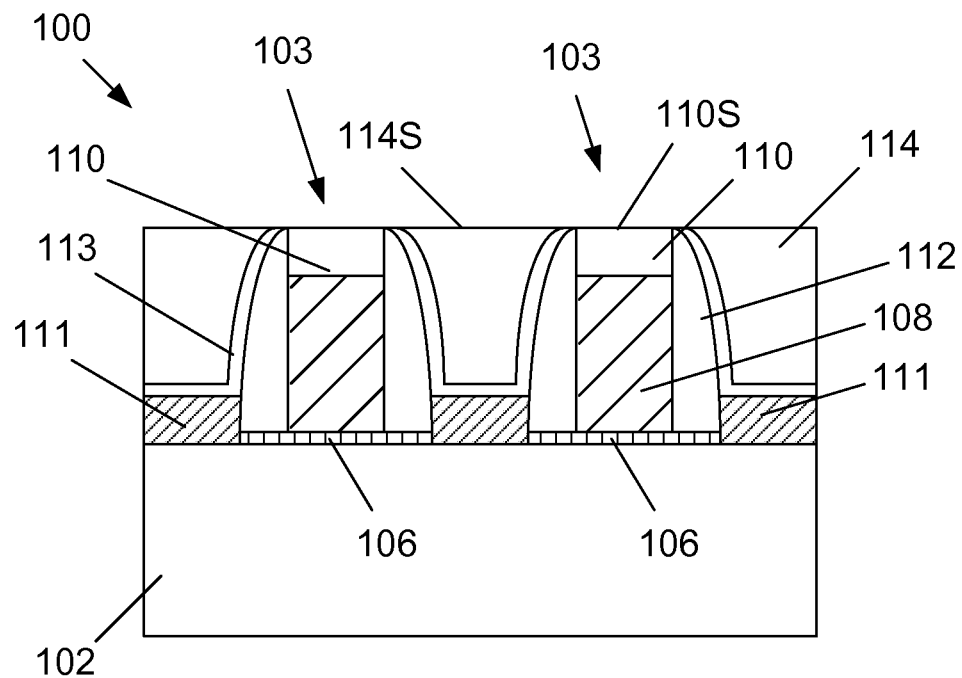
FIGS. 3A-3N depict one illustrative method disclosed herein for forming cap layers on a semiconductor device that employs self-aligned contacts, and the resulting semiconductor device.
Figure 3B:
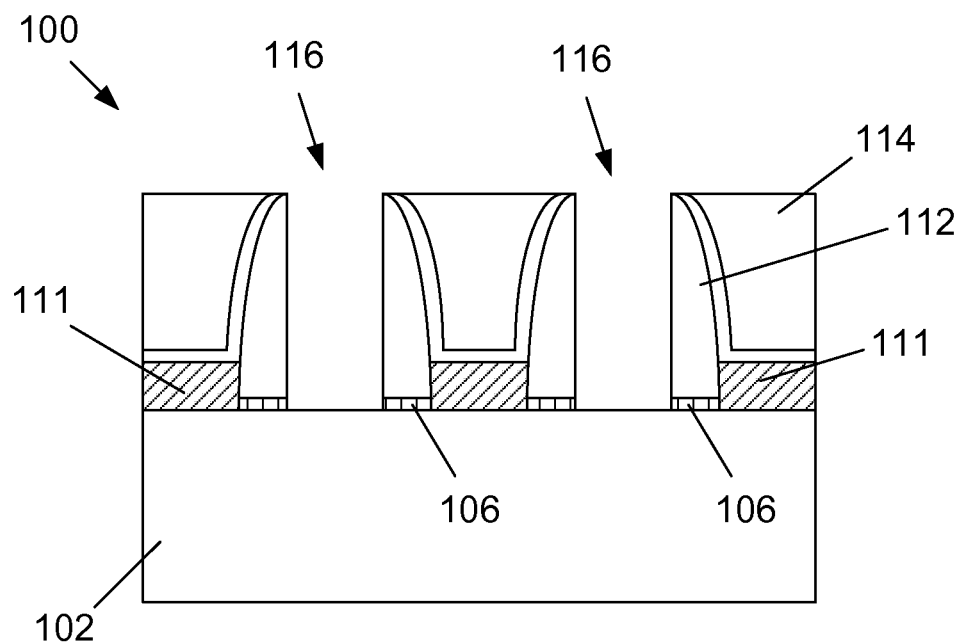
Figure 3C:
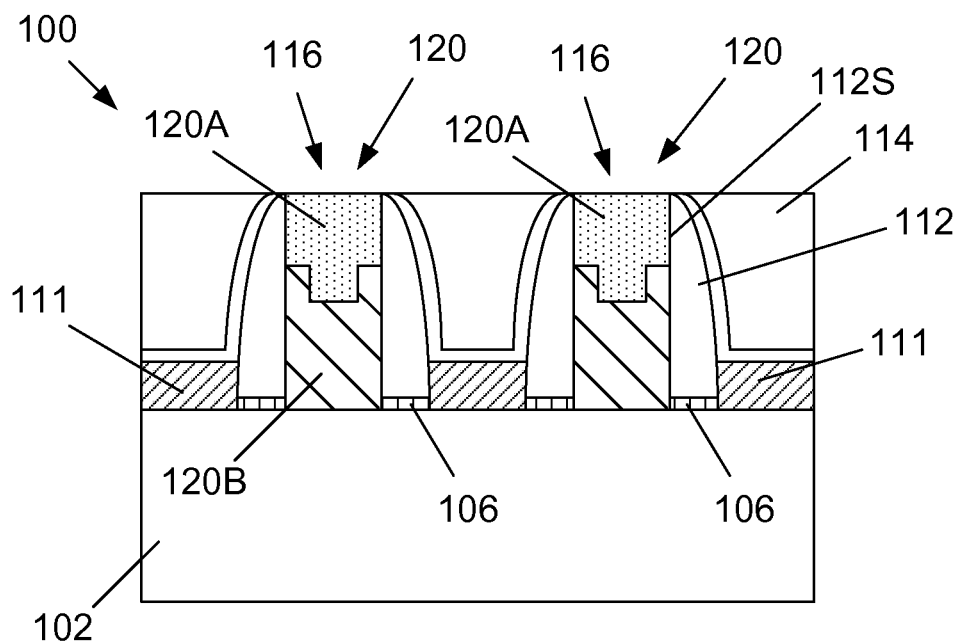
Figure 3D:
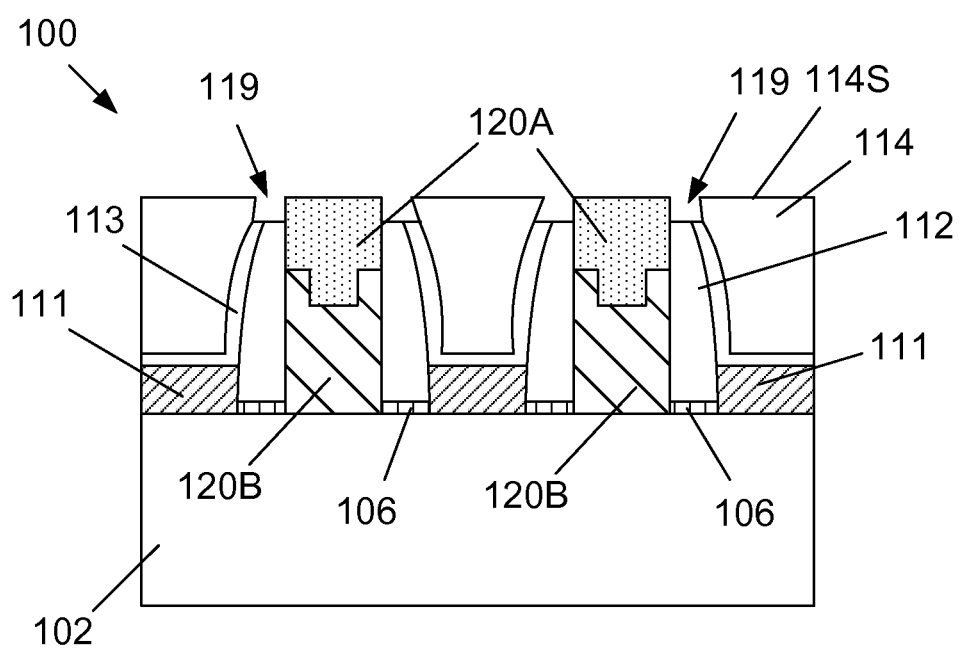
Figure 3E:
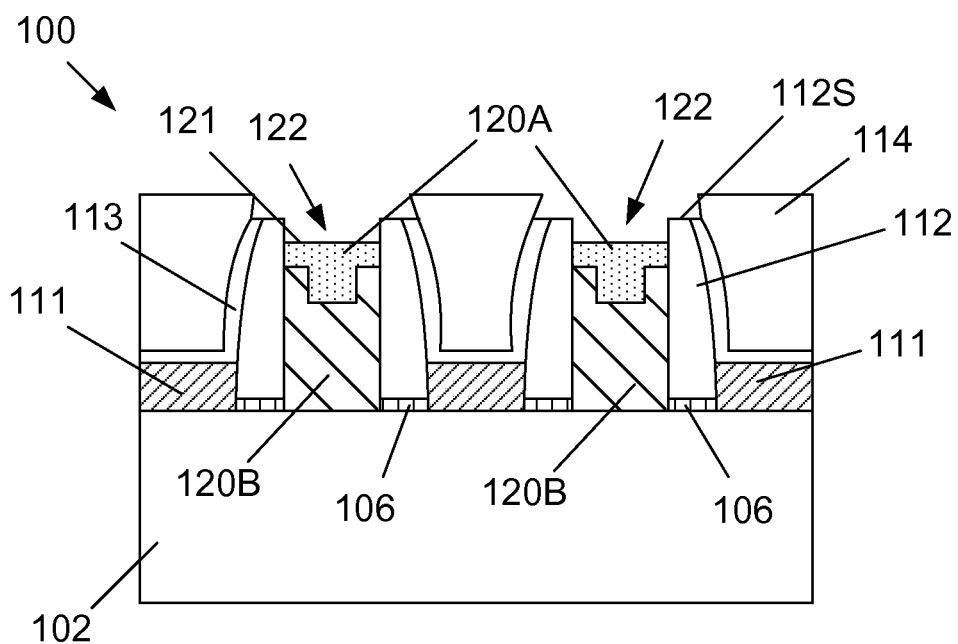
Figure 3F:
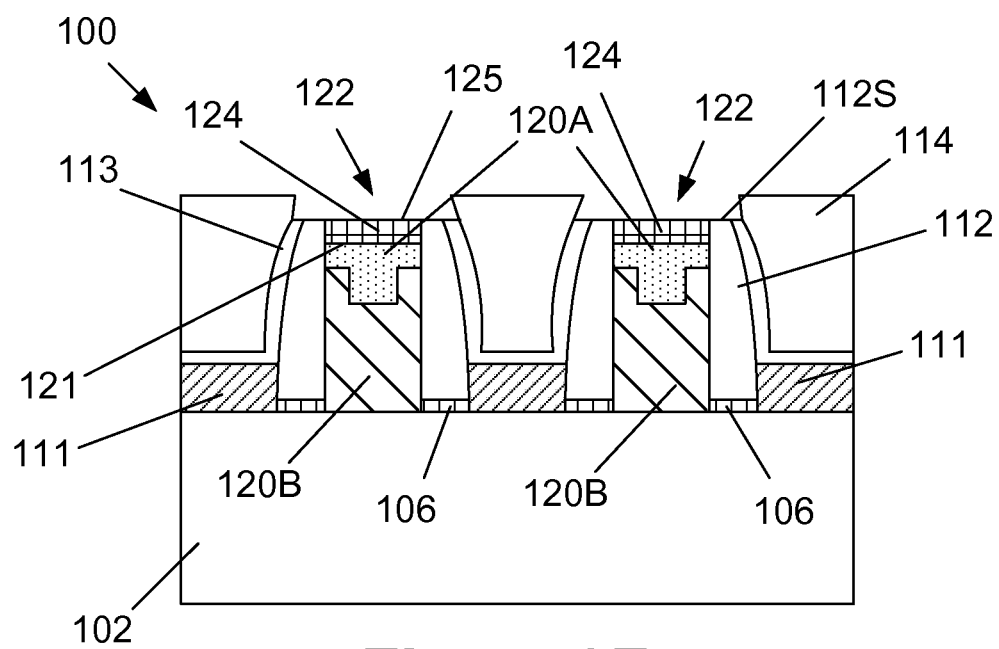
Figure 3G:
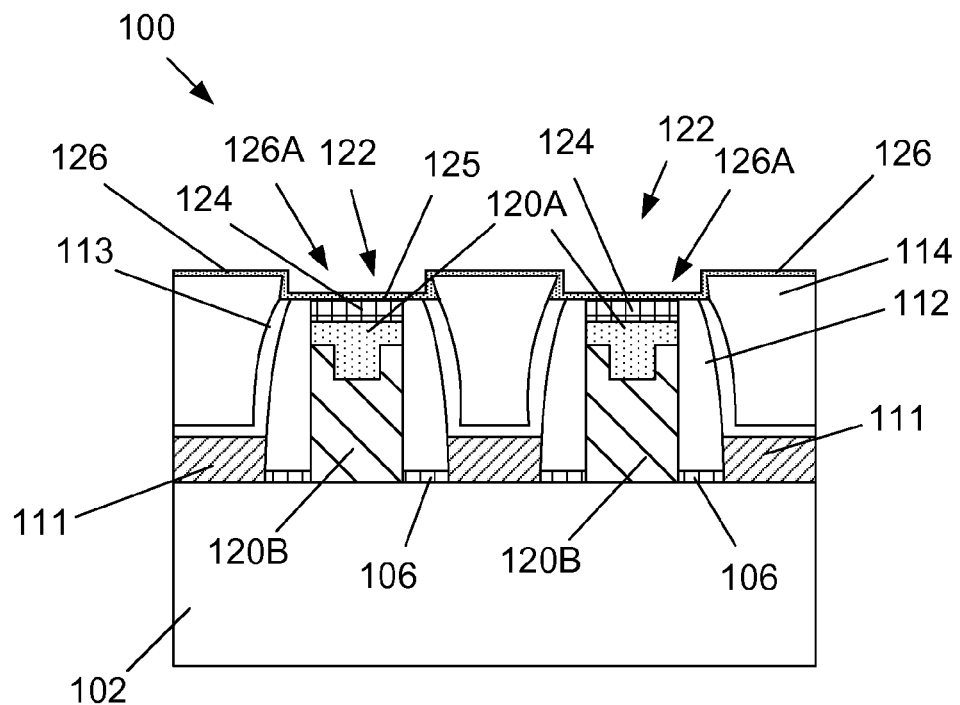
Figure 3H:
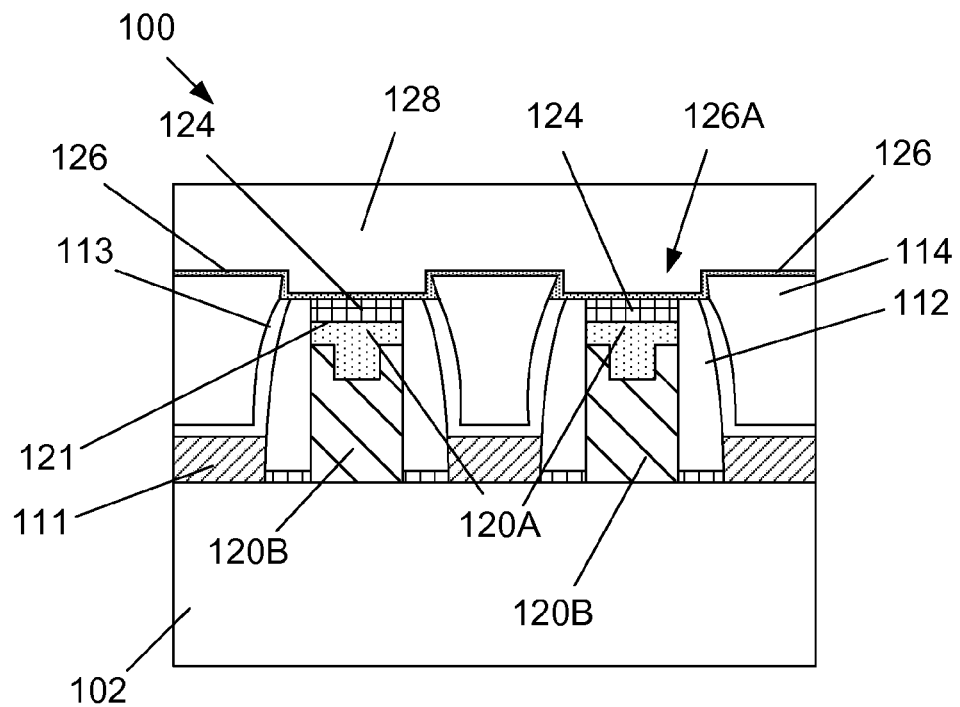
Figure 3I:
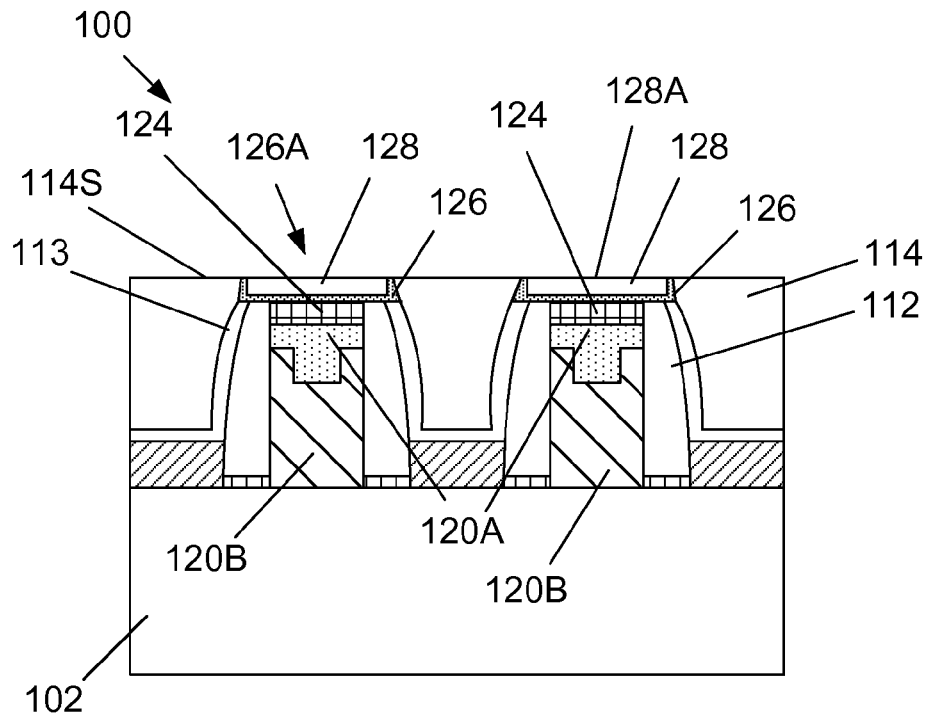
Figure 3J:
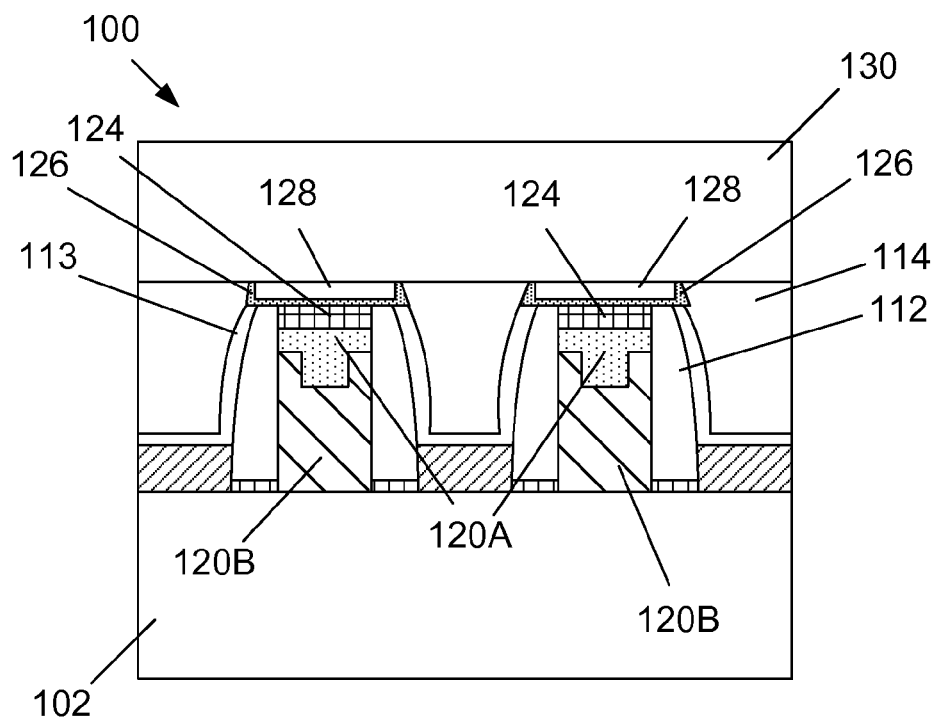
Figure 3K:
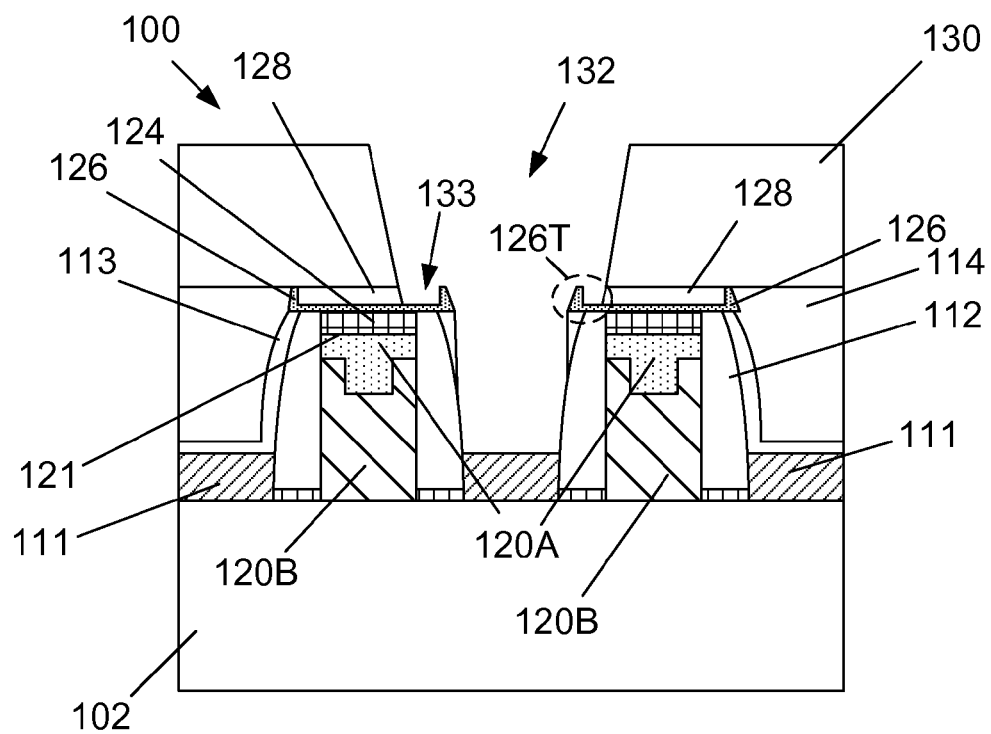
Figure 3L:
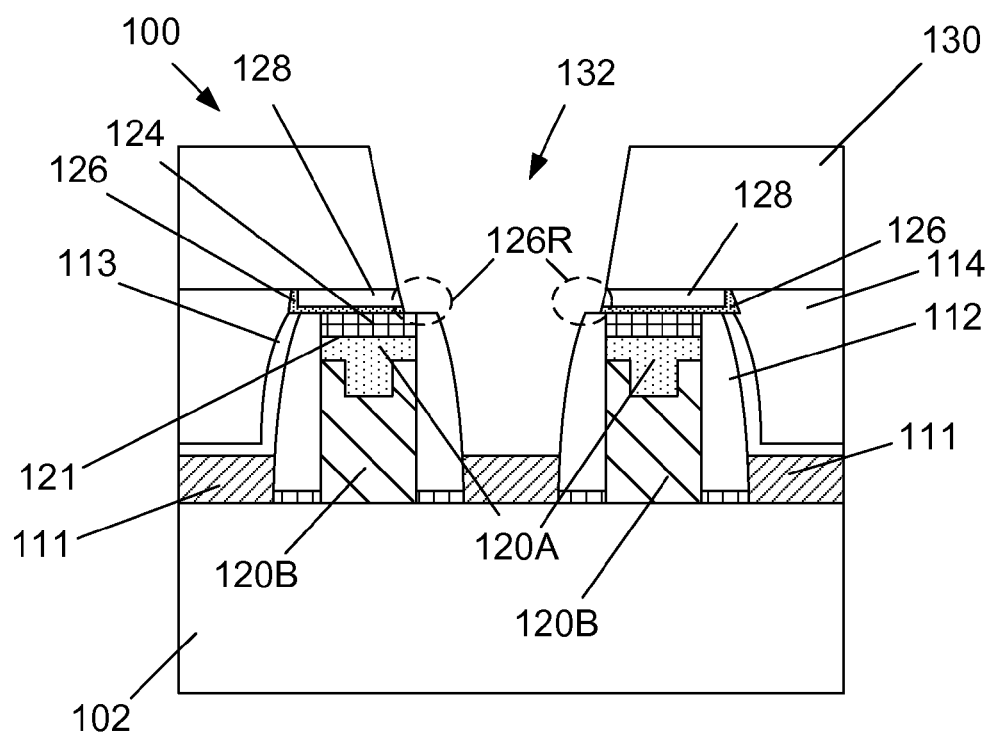
Figure 3M:
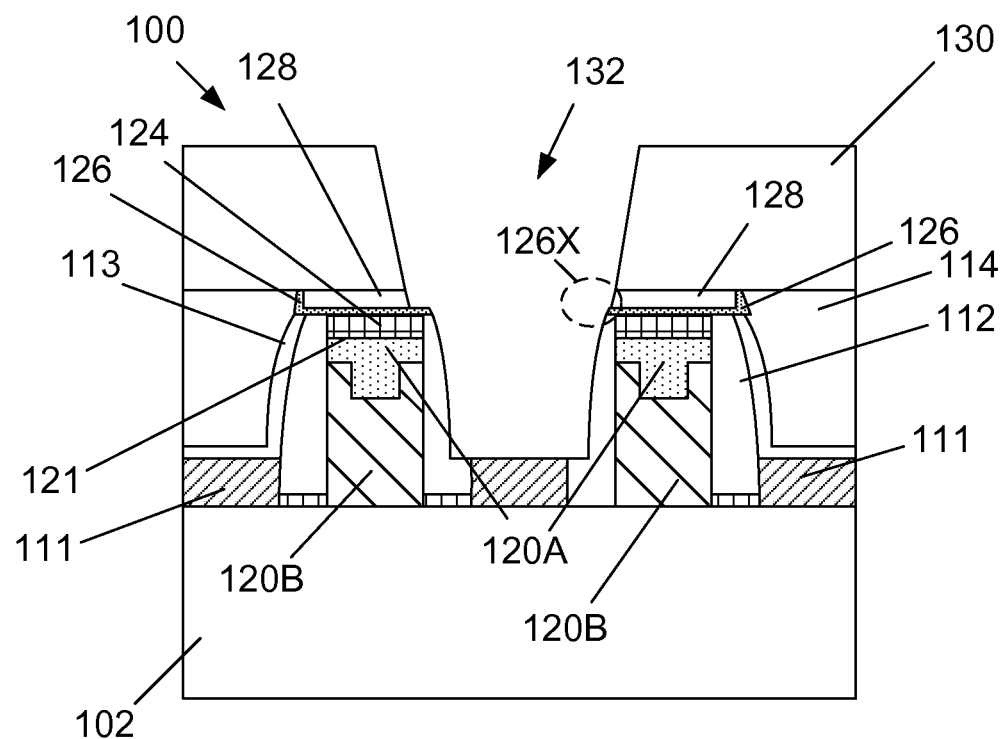
Figure 3N:
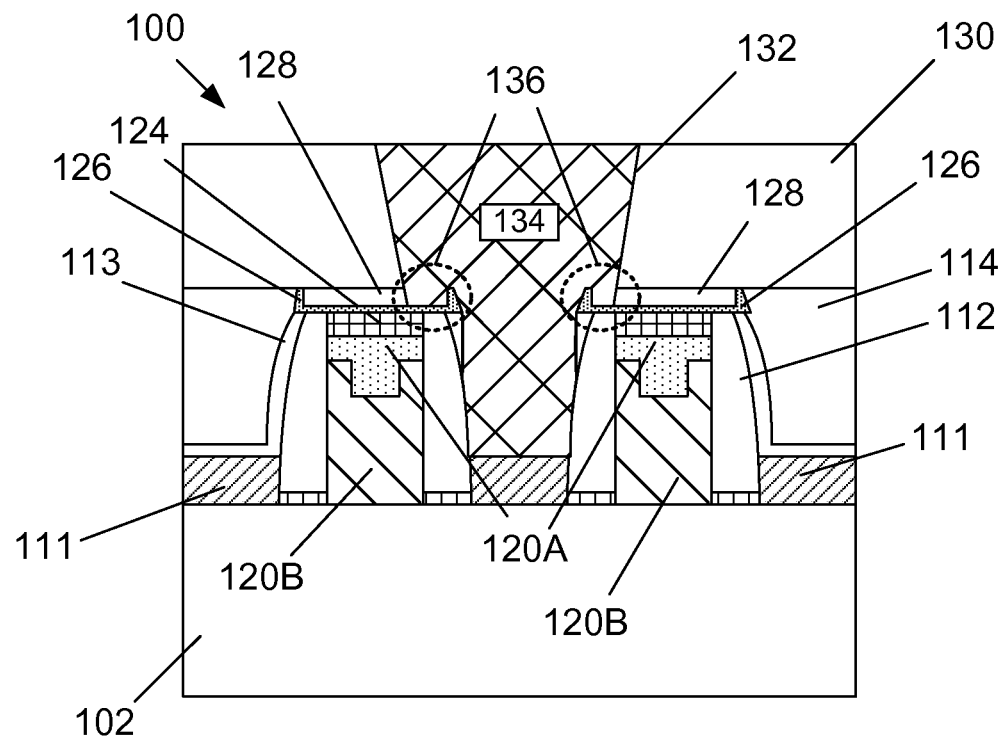

FIGS. 3A-3N depict one illustrative method disclosed herein for forming cap layers for semiconductor devices 100 with self-aligned contacts, and the resulting semiconductor devices 100. FIG. 3A is a simplified view of the illustrative integrated circuit product 100 at an early stage of manufacturing, wherein a pair of illustrative transistors will be formed in and above the semiconductor substrate 102. So as not to obscure the inventions disclosed herein, isolation regions that are formed in the substrate 102 to define active regions where the transistors will be formed are not depicted in the attached drawings. The transistors may be either NMOS or PMOS transistors. Additionally, various doped regions, e.g., source/drain regions, halo implant regions, well regions and the like, are also not depicted in the attached drawings. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

In the example disclosed herein, the transistors will be formed using a replacement gate technique. Accordingly, FIG. 3A depicts the product 100 at a point in fabrication wherein sacrificial gate structures 103 have been formed above the substrate 102. Also depicted are illustrative gate hardmask layers 110 (gate cap layers), sidewall spacers 112, an etch stop liner layer 113, a plurality of raised source/drain regions 111 and a layer of insulating material 114, e.g., silicon dioxide. The gate hardmask layers 110, sidewall spacers 112 and the etch stop liner 113 are typically made of silicon nitride. At this point in the replacement gate process flow, an anneal process would have already been performed to activate the implanted dopant materials and repair any damage to the substrate 102 due to the various ion implantation processes that were performed. The sacrificial gates structures 103 include a sacrificial gate insulation layer 106 and a dummy or sacrificial gate electrode 108. The various components and structures of the product 100 may be formed using a variety of different materials and by performing a variety of known techniques. For example, the sacrificial gate insulation layer 106 may be comprised of silicon dioxide and the sacrificial gate electrode 108 may be comprised of polysilicon. The layers of material depicted in FIG. 3A, as well as the layers of material described below, may be formed by any of a variety of different known techniques, e.g., a chemical vapor deposition (CVD) process, an atomic layer deposition (ALD) process, a thermal growth process, spin-coating techniques, etc. The illustrative raised source/drain regions 111 may be formed in the substrate using traditional techniques, e.g., formation of cavities in the substrate 102 that are self-aligned to the spacers 112, epi deposition of a semiconductor material in the cavities, doping, etc. However, it should be understood that the presently disclosed inventions may be practiced on transistor devices that have regular or planar source/drain regions. Moreover, as used herein and in the attached claims, the word "adjacent" is to be given a broad interpretation and should be interpreted to cover situations where one feature actually contacts another feature or is in close proximity to that other feature. For example, with reference to FIG. 3A, the layer of insulating material 114 is formed adjacent to the sacrificial gate electrode 108, the sidewall spacers 112 and the liner 113, but, in the depicted example, the layer of insulating material 114 only contacts the liner 113. Similarly, it can be stated that the sidewall spacers 112 are formed either adjacent to the gate electrode 108 or that they contact the gate electrode 108.

With continuing reference to FIG. 3A, a planarization process was performed on the layer of insulating material 114 such that the upper surface 114S of the layer of insulating material 114 is substantially even with the upper surface 110S of the gate hardmask layers 110. Importantly, this planarization process exposes the upper surface 110S of the gate hardmask layers 110 such that they can be removed. In one illustrative embodiment, the planarization process may be a chemical mechanical planarization (CMP) process that stops on the gate hardmask layers 110, or it may be a timed etch-back process that removes the layer of insulating material 114 selectively relative to the gate hardmask layers 110. In one embodiment, the layer of insulating material 114 may be a layer of silicon dioxide that is formed by performing a CVD process. The layer of insulating material 114 may be formed to any desired thickness.

FIG. 3B depicts the product 100 after several process operations, e.g., one or more wet or dry etching processes, were performed to remove the gate hardmask layers 110, the sacrificial gate electrode 108 and the sacrificial gate insulation layers 106 to thereby define gate cavities 116 where replacement gate structures will subsequently be formed for the transistors. Typically, the sacrificial gate insulation layer 106 is removed as part of the replacement gate technique, as depicted herein. However, the sacrificial gate insulation layer 106 may not be removed in all applications. Even in cases where the sacrificial gate insulation layer 106 is intentionally removed, there will typically be a very thin native oxide layer (not shown) that forms on the substrate 102 within the gate cavities 116.

FIG. 3C depicts the product after several process operations were performed. First, a pre-clean process was performed in an attempt to remove all foreign materials from within the gate cavities 116 prior to forming the various layers of material that will become part of the replacement gate structures. Thereafter, several known processing operations were performed to form a schematically depicted replacement gate structure 120 in each of the gate cavities 116. The replacement gate structures 120 depicted herein are intended to be representative in nature of any type of gate structure that may be employed in manufacturing integrated circuit products using so-called gate-last (replacement-gate) manufacturing techniques. The replacement gate structure 120 typically comprises a high-k (k value greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer, such as tungsten or aluminum. In the example depicted in FIG. 3C, the replacement gate structures 120 were performed by performing an etch-back process on the high-k gate insulation layer and the metal layers that were formed in the gate cavities 116 prior to the formation of the bulk conductive material layer. Thus, in FIG. 3C, the bulk conductive material portion of the replacement gate structure 120 is labeled with the reference number 120A, while the remaining portions of the replacement gate structure 120 are labeled with the reference number 120B. Of course, in some embodiments, portions of one or more of the high-k gate insulation layer and/or one of the other metal layers that are included in the replacement gate structure 120 may be positioned between the bulk conductive material portion 120A and the spacers 112. So as not to obscure the presently disclosed inventions, the bulk conductive material portion 120A will be depicted in the drawings as spanning the entire lateral width of the gate cavities 116. However, after a complete reading of the present application, those skilled in the art will appreciate that the methods and devices disclosed herein are not limited to the particular configuration of the materials used to initially form the replacement gate structures 120 or to the manner in which the replacement gate structures 120 are initially formed.

FIG. 3D depicts the product 100 after one or more dry or wet etching processes were performed to remove portions of the sidewall spacers 112 and the liner layer 113 to define what will be referred to as recessed spacers that define, in part, spacer recesses 119. In one illustrative embodiment, the spacer recesses 119 may be formed by performing a timed etch-back process. The depth of the spacer recesses 119 (relative to the upper surface 114S of the layer of insulating material 114 may vary depending upon the particular application, e.g., 10-15 nm.

FIG. 3E depicts the product 100 after one or more dry or wet etching processes were performed to remove portions of the materials of the replacement gate structure 120 to define what hereinafter will be referred to as a recessed replacement gate structure. In the depicted example, this etching process results in reducing the thickness of the bulk conductive material portion 120A of the replacement gate structure 120 and in the definition of a replacement gate recess 122. If other materials of construction of the replacement gate structure 120 were exposed by etching the spacer 112 (as depicted in FIG. 3D), then those materials could also be removed if desired. In example shown herein, the recessed bulk conductive material portion 120A has an upper surface 121. In the depicted example, this etching process also exposes a portion of the internal sidewall surfaces of the spacers 112. The depth of the replacement gate recesses 122 (relative to the upper surface 112S of the etched spacers 112) may vary depending upon the particular application, e.g., 10-20 nm. In one embodiment, the upper surfaces 112S of the recessed sidewall spacers is positioned at a level that is above a level of the recessed surface 121 of the recessed replacement gate structure. Of course, as will be appreciated by those skilled in the art after a complete reading of the present application, if desired, the spacer etching process (see FIG. 2D) may be performed after the etching processes were performed to remove portions of the materials of the replacement gate structure 120 (see FIG. 3E).

FIG. 3F depicts the product 100 after a dielectric material 124 has been selectively formed on the upper surface 121 of the reduced-thickness bulk conductive material portion 120A of the replacement gate structure 120. In one embodiment, the dielectric material 124 may be formed such that its upper surface 125 is approximately even with or slightly below the upper surface 112S of the etched spacers 112. In one illustrative embodiment, the dielectric material 124 may be an organosulfur compound material that may be formed by performing known selective self-assembly processes. In one embodiment, the dielectric constant (k value) of such materials may fall within the range of about 3-20. For example, the dielectric material 124 may be formed by the method disclosed on the following articles, each of which are hereby incorporated by reference in their entirety: (1) Ulman, "Formation and Structure of Self-Assembled Monolayers," *Chem. Rev.*, 96:1533-54, 1996; (2) DiBenedetto et al., "Molecular Self-Assembled Monolayers and Multilayers for Organic and Unconventional Inorganic Thin-Film Transistor Applications," *Advanced Materials*, 21:1407-33, 2009; and (3) Ashurst et al., "Dichlorodimethylsilane as an Anti-Stiction Monolayer of MEMS: A Comparison to the Octadecyltrichlosilane Self-Assembled Monolayer," *Journal of Microelectromechanical Systems*, Vol. 10, No. 1, March 2001.

FIG. 3G depicts the device 100 after an etch stop layer 126 was formed above the device depicted in FIG. 3F. In the depicted example, the etch stop layer 126 was formed on the upper surfaces 112S of the recessed sidewall spacers and on the upper surface 125 of the layer of insulating material 124. The etch stop layer 126 may be comprised of a variety of materials, e.g., a layer of high-k insulating material (k value greater than 10), such as hafnium oxide ($HfO_2$), aluminum oxide ($Al_2O_3$), etc., and, in one embodiment, it may have a thickness of about 3-6 nm. The etch stop layer 126 may be formed by performing an ALD process. The etch stop layer 126 defines an etch stop recess 126A.

FIG. 3H depicts the product 100 after a layer of insulating material 128, e.g. silicon dioxide, silicon nitride, etc., was deposited above the product 100 so as to over-fill the etch stop recesses 126A. In one embodiment, the layer of insulating material 128 may be a layer of silicon dioxide that is formed by performing a CVD process. The layer of insulating material 128 may be formed to any desired thickness, and it may be made of the same material as that of the layer of insulating material 114 or it may be a different material.

FIG. 3I depicts the product 100 after one or more planarization processes, e.g., CMP processes, were performed to remove the portions of the layer of insulating material 128 and the etch stop layer 126 positioned above the surface 114S of the layer of insulating material 114 and outside of the replacement gate recesses 122 (see FIG. 3G). Note that these process operations result in portions of the etch stop layer 126 and portions of the layer of insulating material 128 being positioned in the replacement gate recesses 122, and a portion of the layer of insulating material 128 being positioned within the etch stop recess 126A.

FIG. 3J depicts the product 100 after a layer of insulating material 130, e.g., silicon dioxide, a low-k material (k value less than about 3.3), etc., was deposited above the product 100. In one embodiment, the layer of insulating material 130 may be a layer of silicon dioxide that is formed by performing a CVD process. The layer of insulating material 130 may be formed to any desired thickness, and it may be made of the same material as that of the layers of insulating material 114, 128 or it may be a different material.

FIG. 3K depicts the product 100 after one or more etching processes were performed on the product 100 through a patterned etch mask (not shown), such as a patterned layer of photoresist material, to remove portions of the layers of insulating material 130, 114 and the liner layer 113 to thereby define an illustrative self-aligned contact opening 132 that exposes the raised source/drain region 111 so that contact can be made with the source/drain region 111. Only a single contact opening is depicted in the drawings. However, those skilled in the art will appreciate and understand that, in practice, such a contact opening 132 would typically be formed on both sides of each of the transistors. In the depicted example, the self-aligned contact opening 132 is depicted as being somewhat misaligned or enlarged such that portions of the layer of insulating material 128 within the replacement gate recesses 122 are exposed within the contact opening 132. As a result, depending upon the materials selected, the exposed portions of the layer of insulating material 128 may be consumed during the contact etch sequence, as depicted in the region 133 shown in FIG. 3K. Note that the etch stop layer 126 serves to protect the underlying materials during the contact etch process, e.g., it protects the underlying portions of the sidewall spacers 112 and or liner layer 113 during the etch sequence that is performed to form the contact opening 132. That is, the etch stop layers 126 tend to limit the unwanted consumption of at least the sidewall spacers 112 during the contact etch process sequence.

With reference to FIG. 3L, if desired, as part of the contact etch sequence, after the source/drain region is exposed, the exposed portions of the etch stop layer 126 may be removed by performing a very brief etching process that uses an etchant that preferentially removes the exposed portions of the etch stop layer 126 relative to the surrounding materials. The removal of these portions of the etch stop layer 126 is depicted in the dashed-line circles 126R shown in FIG. 3L. Removal of these portions of the etch stop layer 126 may facilitate filing of the contact opening 132. So as not to obscure the present invention, the embodiment where an etching process is performed to remove exposed portions of the etch stop layer 126 will not be depicted in any subsequent drawings.

With reference to FIG. 3M, if desired, given the presence of the etch stop layer 126, the amount of spacer/liner material exposed by the contact opening 132 may be "thinned" or partially removed by increasing the duration of the etching process performed to "punch through" the etch stop liner 113 and expose the source/drain regions 111. The result of such a thinning of the spacer/liner materials is depicted in FIG. 3M. This thinning process is made possible by the relatively high degree of etch selectivity between the etch stop layer 126 and the spacers 112 and the liner 113. Of course, such an over-etching of the spacer/liner materials would need to be performed with great care as excessive consumption of the spacers 112 would run the risk of exposing the gate structures of the transistor devices. Such an over-etching or thinning of the spacer/liner materials would effectively increase the size of the contact opening 132 and the associated contact that will be formed in the contact opening 132. Such a larger contact may be beneficial in reducing the resistance of the overall contact structure. So as not to obscure the present invention, the embodiment where the spacers/liner is intentionally thinned will not be depicted in any subsequent drawings. One other thing to note with respect to FIGS. 3K-3N is that, although the etch stop layer 126 is selected so as to exhibit a relatively high degree of etch selectivity relative to the adjacent insulating materials, during the contact etch sequence, some of the etch stop layer 126 will be consumed, at least to some degree. Thus, the idealized depiction of the "tip" 126T of the etch stop layer 126 shown in FIG. 3K may not be present at the conclusion of the contact etch sequence. Thus, FIG. 3M depicts the case where portions of the tip 126T of the etch stop layer 126 have been consumed during the contact etch sequence, as reflected in the dashed-circle 126X. As depicted, this thinning process is performed to intentionally consume the etch stop layer exposed by the initial contact opening 132 and to consume portions of the then-exposed sidewall spacers 112. Note the reduced lateral width of the spacers 112 in FIG. 3M as compared to those shown in FIG. 3K.

FIG. 3N depicts the product 100 after an illustrative conductive, self-aligned contact structure 134 has been formed in the self-aligned contact opening 132 such that it is conductively coupled to the source/drain regions 111. The self-aligned contact structure 134 is intended to be schematic and representative in nature, as it may be formed using any of a variety of different conductive materials and by performing traditional manufacturing operations. The self-aligned contact structure 134 may also contain one or more barrier layers (not depicted). In one illustrative example, the self-aligned contact structure 134 may be formed by depositing a liner, e.g., a titanium nitride liner, followed by overfilling the self-aligned contact openings 132 with a conductive material, such as tungsten. Thereafter, a CMP process may be performed to planarize the upper surface of the layer of insulating material 130, which results in the removal of excess portions of the liner and the tungsten positioned above the layer of insulating material 130 outside of the self-aligned contact opening 132 and the formation of the self-aligned contact structure 134. If desired, a metal silicide material (not shown) may be formed on the source/drain regions 111 prior to forming the self-aligned contact structure 134. Note that, due to the removal of portions of the layer of insulating material 128 during the contact etch process sequence, portions of the self-aligned contact structure 134 are positioned above portions of the etch stop layer 126, as reflected in the dashed-line enclosed regions 136 shown in FIG. 3N.

As will be appreciated and understood by those skilled in the art after a complete reading of the present application, there are several novel methods and devices disclosed herein. One illustrative method disclosed includes, among other things, forming a replacement gate structure 120 that is positioned within a gate cavity 116 that is laterally defined by sidewall spacers 112 positioned in a first layer of insulating material 114, performing at least one etching process to recess the sidewall spacers 112 and the replacement gate structure 120 and thereby define recessed sidewall spacers (see FIG. 3D) and a recessed replacement gate structure (see FIG. 3E) and forming an etch stop layer 126 above the recessed sidewall spacers and the recessed replacement gate structure, wherein the etch stop layer 126 defines an etch stop recess 126A. In this embodiment, the method also includes forming a second layer of insulating material 128 in the etch stop recess 126A (see FIG. 3I), forming a third layer of insulating material 130 above the second layer of insulating material 128 and above the etch stop layer 126, with said etch stop layer 126 in position, performing at least one first contact etching process to form a self-aligned contact opening 132 that extends through at least the third layer of insulating material 130 and the first layer of insulating material 114 and thereby exposes a source/drain region 111 of the transistor and, with the etch stop layer 126 in position, forming a self-aligned contact 134 in the self-aligned contact opening 132 that is conductively coupled to the source/drain region 111.

Another illustrative method disclosed herein includes, among other things, forming a replacement gate structure 120 that is positioned within a gate cavity 116 that is laterally defined by sidewall spacers 112 positioned in a first layer of insulating material 114, performing at least one etching process to recess the sidewall spacers and the replacement gate structure and thereby define recessed sidewall spacers and a recessed replacement gate structure, selectively forming a second layer of insulating material 124 on an upper surface 121 of the recessed replacement gate structure and forming an etch stop layer 126 comprised of high-k insulating material above the recessed sidewall spacers, the recessed replacement gate structure, the second layer of insulating material 124 and above an upper surface 114S of the first layer of insulating material 114, wherein the etch stop layer 126 defines an etch stop recess 126A. In this embodiment, the method also includes depositing a third layer of insulating material 128 above the etch stop layer 126 so as to over-fill the etch stop recess 126A, performing at least one planarization process to remove portions of the third layer of insulating material 128 and portions of the etch stop layer 126 positioned above the upper surface 114S of the first layer of insulating material 114, forming a fourth layer of insulating material 130 above the third layer of insulating material 128 and above the etch stop layer 126, with the etch stop layer 126 in position, performing at least one first contact etching process to form a self-aligned contact opening 132 that extends through at least the fourth (130) and first (114) layers of insulating material and thereby exposes a source/drain region 111 of the transistor and with the etch stop layer 126 in position, forming a self-aligned contact 134 in the self-aligned contact opening 132 that is conductively coupled to the source/drain region 111.

One illustrative device disclosed herein includes, among other things, a replacement gate structure positioned above a semiconductor substrate 102, sidewall spacers 112 positioned adjacent the replacement gate structure, a first layer of insulating material 114 positioned above the substrate 102 adjacent the sidewall spacers 112, an etch stop layer 126 positioned above upper surface 112S of the sidewall spacers and the upper surface 121 of the replacement gate structure, wherein the etch stop layer 126 defines an etch stop recess 126A, a second layer of insulating material 128 positioned within the etch stop recess 126A, wherein the second layer of insulating material 128 has an upper surface that is substantially planar with an upper surface 114S of the first layer of insulating material 114, a third layer of insulating material 130 positioned above the first layer of insulating material 114, the second layer of insulating material 128 and the etch stop layer 126, and a conductive contact 134 positioned in an opening 132 formed in at least the third layer of insulating material 130 and the first layer of material 114, wherein the conductive contact 134 is conductively coupled to a source/drain region 111 of the transistor.

Yet another illustrative device disclosed herein includes, among other things, a replacement gate structure positioned above a semiconductor substrate 102, sidewall spacers 112 positioned adjacent the replacement gate structure, wherein the upper surface 112S of the sidewall spacers is positioned at a level that is above a level of an upper surface 121 of the replacement gate structure, a first layer of insulating material 114 positioned above the substrate adjacent the sidewall spacers 112, a second layer of insulating material 124 positioned on the upper surface 121 of the replacement gate structure, an etch stop layer 126 positioned on the upper surfaces 112S of the sidewall spacers and on an upper surface 125 of the second layer of insulating material 124, wherein the etch stop layer 126 defines an etch stop recess 126A, a third layer of insulating material 128 positioned within the etch stop recess 126A, wherein the third layer of insulating material 128 has an upper surface that is substantially planar with the upper surface 114S of the first layer of insulating material 114, a fourth layer of insulating material 130 positioned above the first layer of insulating material 114, the third layer of insulating material 128 and the etch stop layer 126, and a conductive contact 134 positioned in an opening 132 formed in at least the fourth layer of insulating material 130 and the first layer of material 114, wherein the conductive contact 134 is conductively coupled to a source/drain region 111 of the transistor.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a transistor, comprising:
    forming a replacement gate structure that is positioned within a gate cavity that is laterally defined by sidewall spacers positioned in a first layer of insulating material;
    performing at least one etching process to recess said sidewall spacers and said replacement gate structure and thereby define recessed sidewall spacers and a recessed replacement gate structure, wherein an upper surface of said recessed sidewall spacers is positioned above an upper surface of said recessed replacement gate structure;
    forming an etch stop layer above said recessed sidewall spacers and said recessed replacement gate structure, said etch stop layer defining an etch stop recess;
    forming a second layer of insulating material in said etch stop recess;
    forming a third layer of insulating material above said second layer of insulating material and above said etch stop layer;
    with said etch stop layer in position, performing at least one first contact etching process to form a self-aligned contact opening that extends through at least said third layer of insulating material and said first layer of insulating material and thereby exposes a source/drain region of said transistor; and
    with said etch stop layer in position, forming a self-aligned contact in said self-aligned contact opening that is conductively coupled to said source/drain region.

2. The method of claim 1, wherein said etch stop layer is comprised of a high-k insulating material.

3. The method of claim 1, wherein performing said at least one etching process to recess said sidewall spacers and said replacement gate structure comprises:
    performing at least one first etching process to recess said sidewall spacers; and
    after performing said at least one first etching process, performing at least one second etching process to recess said replacement gate structure.

4. The method of claim 1, wherein performing said at least one etching process to recess said sidewall spacers and said replacement gate structure comprises:
   performing at least one first etching process to recess said replacement gate structure; and
   after performing said at least one first etching process, performing at least one second etching process to recess said sidewall spacers.

5. The method of claim 1, wherein, after performing said at least one etching process and prior to forming said etch stop layer, the method further comprises selectively forming a fourth layer of insulating material on an upper surface of said recessed replacement gate structure.

6. The method of claim 5, wherein an upper surface of said fourth layer of insulating material is positioned level with or below an upper surface of said recessed sidewall spacers.

7. The method of claim 1, wherein forming said second layer of insulating material in said etch stop recess comprises:
   depositing said second layer of insulating material above said etch stop layer so as to over-fill said etch stop recess; and
   performing at least one planarization process to remove portions of said second layer of insulating material and portions of said etch stop layer positioned above an upper surface of said first layer of insulating material.

8. The method of claim 1, wherein, prior to forming said self-aligned contact, the method comprises performing an etching process to remove portions of said etch stop layer exposed when forming said self-aligned contact opening.

9. The method of claim 1, wherein, during performing said at least one first contact etching process to form said self-aligned contact opening, at least a portion of said second layer of insulating material positioned within said etch stop recess is removed and at least a portion of said etch stop layer is exposed.

10. The method of claim 1, wherein said at least one first contact etching process to form said self-aligned contact opening is performed for a sufficient duration so as to intentionally remove portions of said etch stop liner and said recessed sidewall spacers and thereby increase a size of said contact opening.

11. A method of forming a transistor, comprising:
   forming a replacement gate structure that is positioned within a gate cavity that is laterally defined by sidewall spacers positioned in a first layer of insulating material;
   performing at least one etching process to recess said sidewall spacers and said replacement gate structure and thereby define recessed sidewall spacers and a recessed replacement gate structure;
   selectively forming a second layer of insulating material on an upper surface of said recessed replacement gate structure;
   forming an etch stop layer comprised of high-k insulating material above said recessed sidewall spacers, said recessed replacement gate structure, said second layer of insulating material and above an upper surface of said first layer of insulating material, said etch stop layer defining an etch stop recess;
   forming a third layer of insulating material in said etch stop recess by:
      depositing said third layer of insulating material above said etch stop layer so as to over-fill said etch stop recess; and
      performing at least one planarization process to remove portions of said third layer of insulating material and portions of said etch stop layer positioned above an upper surface of said first layer of insulating material;
   forming a fourth layer of insulating material above said third layer of insulating material and above said etch stop layer;
   with said etch stop layer in position, performing at least one first contact etching process to form a self-aligned contact opening that extends through at least said fourth layer of insulating material and said first layer of insulating material and thereby exposes a source/drain region of said transistor; and
   with said etch stop layer in position, forming a self-aligned contact in said self-aligned contact opening that is conductively coupled to said source/drain region.

12. The method of claim 11, wherein performing said at least one etching process to recess said sidewall spacers and said replacement gate structure comprises:
   performing at least one first etching process to recess said sidewall spacers; and
   after performing said at least one first etching process, performing at least one second etching process to recess said replacement gate structure.

13. The method of claim 11, wherein performing said at least one etching process to recess said sidewall spacers and said replacement gate structure comprises:
   performing at least one first etching process to recess said replacement gate structure; and
   after performing said at least one first etching process, performing at least one second etching process to recess said sidewall spacers.

14. The method of claim 11, wherein an upper surface of said recessed sidewall spacers is positioned above an upper surface of said recessed replacement gate structure.

15. The method of claim 14, wherein an upper surface of said second layer of insulating material is positioned level with or below said upper surface of said recessed sidewall spacers.

16. The method of claim 11, wherein, selectively forming said second layer of insulating material on said upper surface of said recessed replacement gate structure comprises performing a selective self-assembly process.

17. The method of claim 11, wherein said at least one first contact etching process to form said self-aligned contact opening is performed for a sufficient duration so as to intentionally remove portions of said etch stop liner and said recessed sidewall spacers and thereby increase a size of said contact opening.

18. The method of claim 11, wherein, prior to forming said self-aligned contact, the method comprises performing an etching process to remove portions of said etch stop layer exposed when forming said self-aligned contact opening.

19. A method of forming a transistor, comprising:
   forming a replacement gate structure that is positioned within a gate cavity that is laterally defined by sidewall spacers positioned in a first layer of insulating material;
   performing at least one etching process to recess said sidewall spacers and said replacement gate structure and thereby define recessed sidewall spacers and a recessed replacement gate structure;
   after performing said at least one etching process, selectively forming a second layer of insulating material on an upper surface of said recessed replacement gate structure, wherein an upper surface of said second layer of insulating material is positioned level with or below an upper surface of said recessed sidewall spacers;
   after selectively forming said second layer of insulating material, forming an etch stop layer above said recessed sidewall spacers and said recessed replacement gate structure, said etch stop layer defining an etch stop recess;

forming a third layer of insulating material in said etch stop recess;

forming a fourth layer of insulating material above said third layer of insulating material and above said etch stop layer;

with said etch stop layer in position, performing at least one first contact etching process to form a self-aligned contact opening that extends through at least said fourth layer of insulating material and said first layer of insulating material and thereby exposes a source/drain region of said transistor; and with said etch stop layer in position, forming a self-aligned contact in said self-aligned contact opening that is conductively coupled to said source/drain region.

20. A method of forming a transistor, comprising:

forming a replacement gate structure that is positioned within a gate cavity that is laterally defined by sidewall spacers positioned in a first layer of insulating material;

performing at least one etching process to recess said sidewall spacers and said replacement gate structure and thereby define recessed sidewall spacers and a recessed replacement gate structure;

forming an etch stop layer above said recessed sidewall spacers and said recessed replacement gate structure, said etch stop layer defining an etch stop recess;

forming a second layer of insulating material in said etch stop recess, wherein forming said second layer of insulating material in said etch stop recess comprises:
  depositing said second layer of insulating material above said etch stop layer so as to over-fill said etch stop recess; and
  performing at least one planarization process to remove portions of said second layer of insulating material and portions of said etch stop layer positioned above an upper surface of said first layer of insulating material;

forming a third layer of insulating material above said second layer of insulating material and above said etch stop layer;

with said etch stop layer in position, performing at least one first contact etching process to form a self-aligned contact opening that extends through at least said third layer of insulating material and said first layer of insulating material and thereby exposes a source/drain region of said transistor; and with said etch stop layer in position, forming a self-aligned contact in said self-aligned contact opening that is conductively coupled to said source/drain region.

21. A method of forming a transistor, comprising:

forming a replacement gate structure that is positioned within a gate cavity that is laterally defined by sidewall spacers positioned in a first layer of insulating material;

performing at least one etching process to recess said sidewall spacers and said replacement gate structure and thereby define recessed sidewall spacers and a recessed replacement gate structure;

forming an etch stop layer above said recessed sidewall spacers and said recessed replacement gate structure, said etch stop layer defining an etch stop recess;

forming a second layer of insulating material in said etch stop recess;

forming a third layer of insulating material above said second layer of insulating material and above said etch stop layer;

with said etch stop layer in position, performing at least one first contact etching process to form a self-aligned contact opening that extends through at least said third layer of insulating material and said first layer of insulating material and thereby exposes a source/drain region of said transistor;

performing an etching process to remove portions of said etch stop layer exposed when forming said self-aligned contact opening; and with said etch stop layer in position, forming a self-aligned contact in said self-aligned contact opening that is conductively coupled to said source/drain region.

22. A method of forming a transistor, comprising:

forming a replacement gate structure that is positioned within a gate cavity that is laterally defined by sidewall spacers positioned in a first layer of insulating material;

performing at least one etching process to recess said sidewall spacers and said replacement gate structure and thereby define recessed sidewall spacers and a recessed replacement gate structure;

forming an etch stop layer above said recessed sidewall spacers and said recessed replacement gate structure, said etch stop layer defining an etch stop recess;

forming a second layer of insulating material in said etch stop recess;

forming a third layer of insulating material above said second layer of insulating material and above said etch stop layer;

with said etch stop layer in position, performing at least one first contact etching process to form a self-aligned contact opening that extends through at least said third layer of insulating material and said first layer of insulating material and thereby exposes a source/drain region of said transistor; wherein, during performing said at least one first contact etching process to form said self-aligned contact opening, at least a portion of said second layer of insulating material positioned within said etch stop recess is removed and at least a portion of said etch stop layer is exposed; and with said etch stop layer in position, forming a self-aligned contact in said self-aligned contact opening that is conductively coupled to said source/drain region.

23. A method of forming a transistor, comprising:

forming a replacement gate structure that is positioned within a gate cavity that is laterally defined by sidewall spacers positioned in a first layer of insulating material;

performing at least one etching process to recess said sidewall spacers and said replacement gate structure and thereby define recessed sidewall spacers and a recessed replacement gate structure;

forming an etch stop layer above said recessed sidewall spacers and said recessed replacement gate structure, said etch stop layer defining an etch stop recess;

forming a second layer of insulating material in said etch stop recess;

forming a third layer of insulating material above said second layer of insulating material and above said etch stop layer;

with said etch stop layer in position, performing at least one first contact etching process to form a self-aligned contact opening that extends through at least said third layer of insulating material and said first layer of insulating material and thereby exposes a source/drain region of said transistor, wherein said at least one first contact etching process to form said self-aligned contact opening is performed for a sufficient duration so as to intentionally remove portions of said etch stop liner and said recessed sidewall spacers and thereby increase a size of said contact opening; and with said etch stop layer in position, forming a self-aligned contact in said self-aligned contact opening that is conductively coupled to said source/drain region.

* * * * *